United States Patent
Moosburger et al.

(10) Patent No.: US 10,546,987 B2
(45) Date of Patent: Jan. 28, 2020

(54) METHOD FOR PRODUCING A COMPONENT, AND A COMPONENT

(71) Applicant: OSRAM Opto Semiconductors GmbH, Regensburg (DE)

(72) Inventors: Juergen Moosburger, Lappersdorf (DE); Lutz Hoeppel, Alteglofsheim (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 41 days.

(21) Appl. No.: 15/747,455

(22) PCT Filed: Jul. 20, 2016

(86) PCT No.: PCT/EP2016/067298
§ 371 (c)(1),
(2) Date: Jan. 25, 2018

(87) PCT Pub. No.: WO2017/016953
PCT Pub. Date: Feb. 2, 2017

(65) Prior Publication Data
US 2018/0219146 A1    Aug. 2, 2018

(30) Foreign Application Priority Data
Jul. 28, 2015  (DE) .................. 10 2015 214 222

(51) Int. Cl.
*H01L 33/62*     (2010.01)
*H01L 33/48*     (2010.01)
*H01L 33/54*     (2010.01)
(Continued)

(52) U.S. Cl.
CPC .......... *H01L 33/62* (2013.01); *H01L 33/0079* (2013.01); *H01L 33/486* (2013.01);
(Continued)

(58) Field of Classification Search
CPC ..... H01L 33/62; H01L 21/563; H01L 33/647; H01L 2933/005
See application file for complete search history.

(56) References Cited

U.S. PATENT DOCUMENTS

| 8,581,291 B2 | 11/2013 | Shimokawa et al. |
| 2003/0235976 A1 | 12/2003 | Zakel et al. |
| (Continued) | | |

FOREIGN PATENT DOCUMENTS

| DE | 19754372 A1 | 9/1998 |
| DE | 10130290 A1 | 1/2003 |
| EP | 2393131 A1 | 12/2011 |

OTHER PUBLICATIONS

German Search Report based on application No. 10 2015 214 222.1 (8 pages) dated Apr. 22, 2016 (for reference purpose only).
(Continued)

*Primary Examiner* — Changhyun Yi
(74) *Attorney, Agent, or Firm* — Viering, Jentschura & Partners MBB

(57) ABSTRACT

A method for producing a component may include providing a composite containing a semiconductor stack layer, a first exposed connection layer and a second exposed connection layer, where the connection layers are arranged on the semiconductor stack, assigned to different electrical polarities and are configured to electrically contact the component to be produced; forming a first through contact exposed in lateral directions on the first connection layer and a second through contact exposed in lateral directions on the second connection layer, where the through contacts are formed from an electrically conductive connection material; and applying a molded body material on the composite for forming a molded body, where each of the through contacts are fully and circumferentially enclosed by the molded body at least in the lateral directions, such that the molded body
(Continued)

and the through contacts form a permanently continuous carrier which mechanically carries the component to be produced.

20 Claims, 6 Drawing Sheets

(51) Int. Cl.
  *H01L 33/00* (2010.01)
  *H01L 33/60* (2010.01)
(52) U.S. Cl.
  CPC .............. *H01L 33/54* (2013.01); *H01L 33/60* (2013.01); *H01L 2224/11* (2013.01); *H01L 2224/47* (2013.01)

(56) References Cited

U.S. PATENT DOCUMENTS

| | | |
|---|---|---|
| 2009/0218588 A1 | 9/2009 | Panaccione et al. |
| 2012/0241793 A1 | 9/2012 | In et al. |
| 2013/0026518 A1 | 1/2013 | Suh et al. |
| 2015/0200336 A1 | 7/2015 | Bhat et al. |
| 2015/0280089 A1* | 10/2015 | Obata ..................... H01L 33/62 257/98 |

OTHER PUBLICATIONS

International Search Report based on application No. PCT/EP2016/067298 (5 pages + 2 pages English translation) dated Oct. 7, 2016 (for reference purpose only).

\* cited by examiner

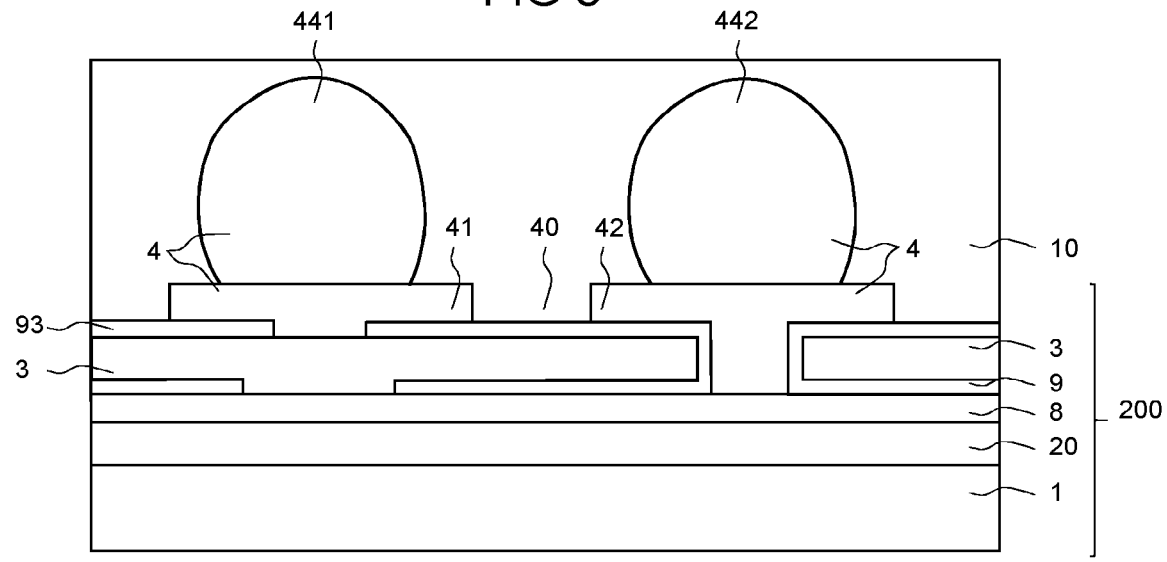
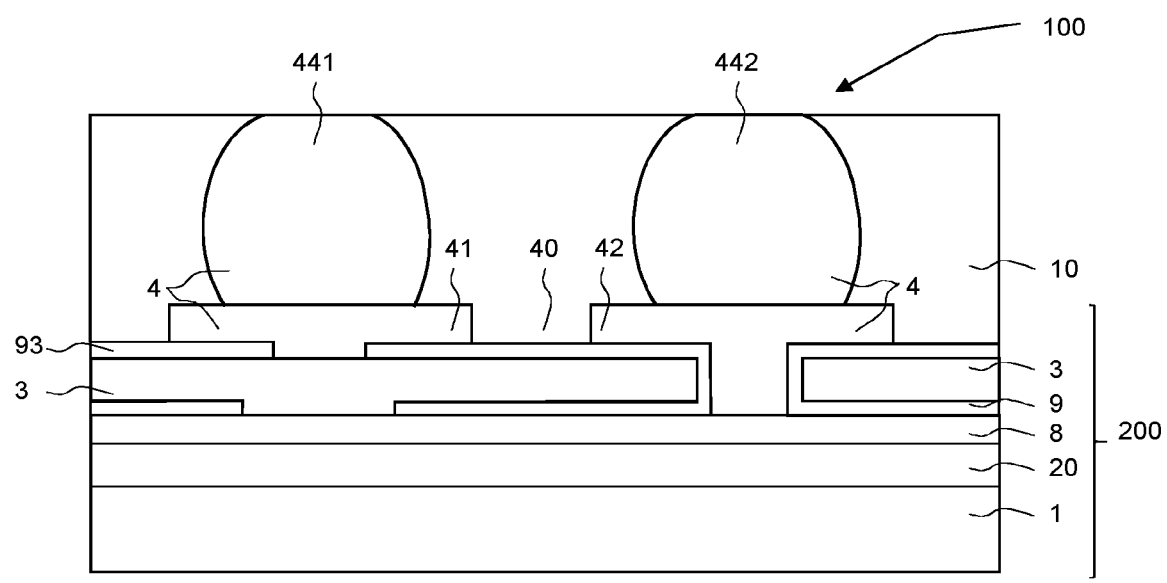

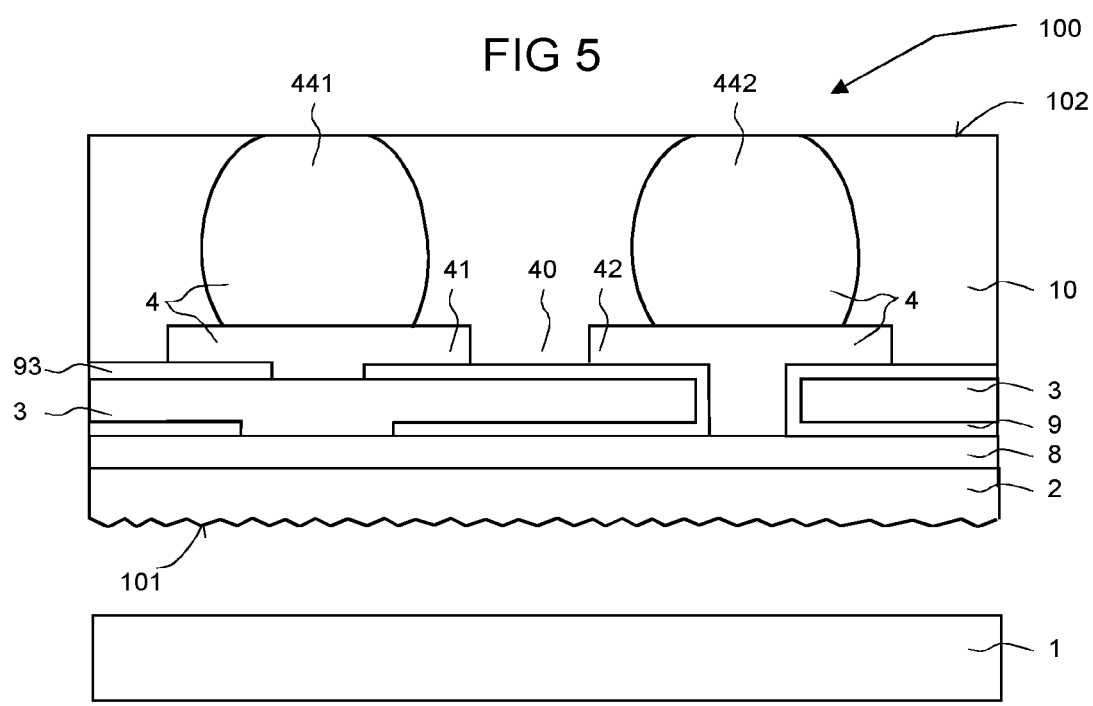
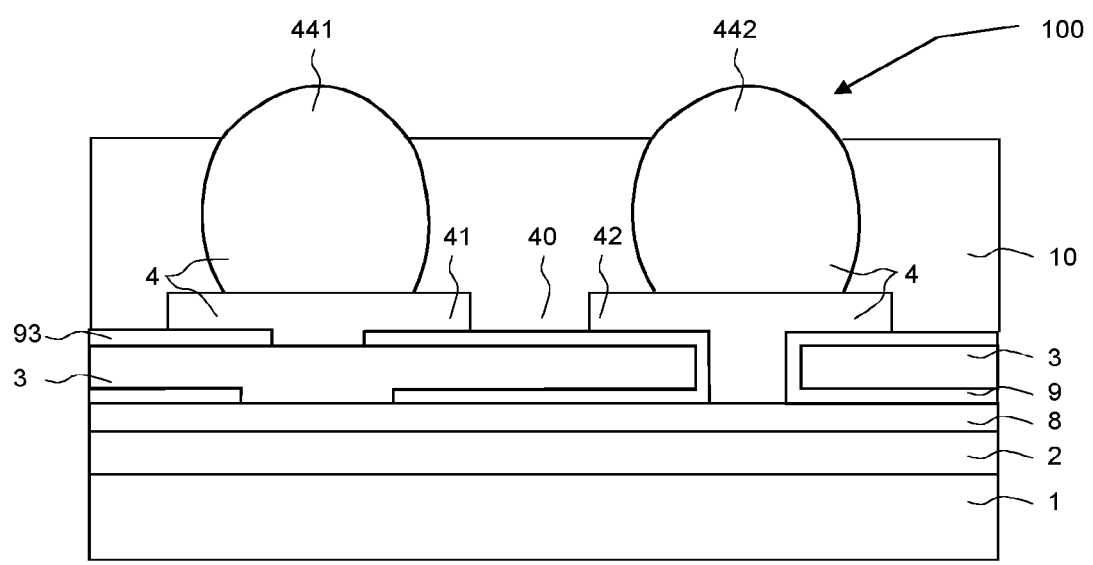

METHOD FOR PRODUCING A COMPONENT, AND A COMPONENT

CROSS-REFERENCE TO RELATED APPLICATIONS

This patent application is a national stage entry of International Application No. PCT/EP2016/067298 under 35 U.S.C. §§ 365 and 371, filed on Jul. 20, 2016, which claims priority to German Patent Application Serial No. 10 2015 214 222.1, which was filed on Jul. 28, 2015. The disclosures of each of the foregoing documents are incorporated herein by reference in their entirety and for all purposes.

FIELD

A method for producing one or a plurality of components, and a component are specified.

BACKGROUND

When forming a carrier directly on a semiconductor chip at the wafer level, the semiconductor chip can be encapsulated with a potting compound, thereby forming a component including the semiconductor chip and the cured potting compound as a housing. However, great technical complexity and thus high production costs are required when producing through contacts for the electrical contacting of the component through the carrier.

SUMMARY

One aspect of the present disclosure is to specify a simplified and at the same time efficient method for producing one or a plurality of components. A further aspect of the present disclosure is to specify a component producible in a simplified manner and having a high mechanical stability.

In accordance with at least one aspect of the present disclosure a method for producing one component or a plurality of components, and a composite including a semiconductor layer stack and connection layers on the semiconductor layer stack is provided. The composite may, for example, be a wafer composite. The wafer composite may include a growth substrate, on which the semiconductor layer stack is applied for instance by a coating method, e.g., by an epitaxy method. In particular, the composite includes a first exposed connection layer and a second exposed connection layer, which are configured for the electrical contacting of the component to be produced and are assigned to different electrical polarities. Moreover, the composite may include a plurality of such first connection layers and a plurality of such second connection layers. The first connection layer and the second connection layer are spaced apart from one another spatially for example in a lateral direction by an intermediate region. The semiconductor layer stack may include a plurality of semiconductor layers, for instance a first semiconductor layer of a first charge carrier type, a second semiconductor layer of a second charge carrier type, and an active layer, which, for example, is configured for detecting or for emitting electromagnetic radiation during operation of the component to be produced. An exposed connection layer means that a surface of the connection layer facing away from the semiconductor layer stack is present such that it is not covered at least in part by an electrically insulating material.

A lateral direction is understood to mean a direction which runs parallel, in particular, to a main extension surface of the semiconductor layer stack. A vertical direction is understood to mean a direction which is directed perpendicularly, in particular, to the main extension surface of the semiconductor layer stack. In particular, the vertical direction and the lateral direction are directed transversely, for instance perpendicularly, with respect to one another.

In accordance with at least one configuration of the method, the composite includes a first metal layer for mechanically stabilizing the semiconductor layer stack or the component to be produced, wherein the first metal layer is arranged between the semiconductor layer stack and the connection layers. The first metal layer can be deposited onto the semiconductor layer stack by means of a coating method. In particular, the first metal layer has an average vertical thickness which is greater than an average vertical thickness of the connection layers. In a plan view the first metal layer can bridge the intermediate region formed in the lateral direction between the connection layers along a lateral longitudinal direction. In a plan view the first metal layer overlaps in particular both the first connection layer and the second connection layer. In particular, the first metal layer is free of an interruption in the region of the intermediate region.

In the region of the intermediate region the first metal layer can additionally have a lateral width along a lateral transverse direction running transversely or perpendicularly with respect to the longitudinal direction, wherein the lateral width of the first metal layer differs at most by 30% or at most by 20% or at most by 10% from a lateral width of the connection layers along the lateral transverse direction. In this case, the lateral width of the first metal layer can be less than the lateral width of the connection layers. Overall the first metal layer can cover for example a large part of the intermediate region, for instance at least 60%, at least 70% or at least 90% of the intermediate region. It is also possible for the first metal layer to completely cover the intermediate region. By means of the first metal layer, the component to be produced can be mechanically reinforced in particular at locations of the intermediate region, thereby avoiding possible mechanical weak points in the region of the intermediate region.

The semiconductor layer stack may include a first semiconductor layer of a first charge carrier type and a second semiconductor layer of a second charge carrier type. Furthermore, the semiconductor layer stack includes an active layer, which is arranged in particular between the first and second semiconductor layers. For example, the active layer is a p-n junction zone. In this case, the active layer can be formed as one layer or as a layer sequence of a plurality of layers. The active layer is configured in particular to emit an electromagnetic radiation for instance in the visible, ultraviolet or infrared spectral range or to absorb an electromagnetic radiation and to convert said electromagnetic radiation into electrical signals or electrical energy. The semiconductor layer stack can be applied on a growth substrate layer by layer by an epitaxy method. The composite can therefore also include a growth substrate, on which the semiconductor layer stack is arranged. However, the growth substrate can be removed from the semiconductor layer stack in a subsequent method step, such that the component to be produced is in particular free of a growth substrate.

The semiconductor layer stack includes a first main surface, which is formed for example as a radiation passage surface. Furthermore, the semiconductor layer stack includes a second main surface, which faces away from the first main surface and is formed for example by a surface of a semiconductor layer, for instance of the second semiconductor layer. In particular, the first main surface and the second main surface delimit the semiconductor layer stack in the vertical direction. In particular, the first main surface adjoins the growth substrate. The connection layers are arranged on the semiconductor layer stack in particular on the side of the second main surface.

In accordance with at least one embodiment of the method, a first through contact exposed in lateral directions is formed, for example, directly on the first connection layer. Furthermore, a second through contact exposed in lateral directions can be formed directly on the second connection layer. The through contacts can be formed from an electrically conductive connection material. A through contact exposed in lateral directions means that the through contact, during the process of forming it or directly after the process of forming it on the connection layer, has a side surface which is at least regionally or completely free of an electrically insulating material or a further electrically conductive material of the component to be produced. If the through contacts are formed by a stencil printing method, for instance, wherein the stencil is removed in a subsequent method step and is thus not part of the component to be produced, the through contacts are still regarded as exposed provided that their side surfaces directly after their completion, for instance directly after the removal of the stencil, are not covered by a further material.

The through contacts and connection layers form a second metal layer of the component to be produced. The second metal layer can thus be subdivided into at least two partial regions spaced apart laterally from one another, wherein a first partial region includes a first through contact and a first connection layer and a second partial region includes a second through contact and a second connection layer.

The second metal layer can indeed be formed in a single method step, for instance by means of an electrolytic or electroless coating method. However, this necessitates a dry resist layer having a thickness at least equal to a vertical thickness of the second metal layer. This comparatively thick dry resist layer has to be structured before the second metal layer is applied, and has to be removed after the second metal layer has been applied. On account of the comparatively large thickness of the second metal layer, which can be for instance 100 µm or a few hundred micrometers, processes regarding the structuring and subsequent removal of the dry resist layer are associated with great complexity. By forming the second metal layer in steps, namely by forming the relatively thin connection layers and forming the through contacts on the connection layers, it is possible for the formation of the second metal layer to be carried out in a simplified, reliable and efficient manner, for instance by means of a combination of different methods for applying a metal layer.

In accordance with at least one embodiment of the method, the first and/or second through contact are/is formed in each case as a connection column. A column is generally understood to mean a geometric structure having a vertical height, a lateral width and a lateral cross section, wherein the lateral cross section has a substantially unchanged shape along the vertical direction, that is to say along the height, and wherein an absolute value regarding an area of the cross section along the vertical direction in particular does not change abruptly. The through contact in this sense is formed integrally, in particular, and is producible in a single method step. For example, the lateral cross section of the column or of the through contact has the shape of a circle, a polygon, an ellipse or other shapes. An aspect ratio regarding the height to width can be between 0.1 and 10 inclusive, for instance between 0.3 and 3 inclusive, or more. A geometric structure having abruptly changing areas of the cross section along the vertical direction, for instance with a step on side surfaces of the geometric structure, is often attributable to a composite composed of two or more partial layers produced in separate method steps, and in case of doubt should not be understood as the through contact described here in the form of an integrally produced column.

In accordance with at least one embodiment of the method, a molded body material for forming a molded body is applied on the composite for instance from the side of the second main surface of the semiconductor layer stack. In particular, the through contacts, after their completion and after the molded body material has been applied, are thereby enclosed by the molded body fully circumferentially in each case at least in the lateral directions, such that the molded body adheres to the through contacts and thus together with the through contacts forms a permanently continuous carrier which mechanically carries the component to be produced. The formation of the molded body is, for example, carried out after the completion of the through contacts, for instance after the through contacts have been formed and/or fixed on the connection layers.

The molded body material can be applied on the composite such that the resultant molded body completely covers the through contacts in a plan view of the semiconductor layer stack. In this case, in order to expose the through contacts, the molded body can be partly etched, mechanically eroded, ground or partly removed by laser ablation. Alternatively, it is also possible to apply the molded body material on the composite such that the through contacts remain partly not covered by the molded body material. In particular, the through contacts are formed, after completion of the component, such that they extend through the molded body.

In a method for producing a component, a composite including a semiconductor layer stack, a first exposed connection layer and a second exposed connection layer is provided. The first and second connection layers are arranged on the semiconductor layer stack, wherein the connection layers are assigned to different electrical polarities and are configured for the electrical contacting of the component to be produced. A first through contact is formed on the first connection layer, wherein the first through contact is exposed at least in lateral directions for instance directly after the completion thereof. A second through contact is formed on a second connection layer, wherein the second through contact is exposed at least in lateral directions for instance directly after the completion thereof. After the through contacts have been formed, a material for forming a molded body is applied on the composite. The through contacts are enclosed here by the molded body fully circumferentially in each case at least in the lateral directions. As a result, a permanently continuous stable carrier can be formed from the molded body and the through contacts, wherein the carrier is formed such that it mechanically carries the component to be produced.

The component to be produced can be externally electrically contacted via the connection layers and through contacts. The connection layers and through contacts can be formed in two separate method steps, wherein the connection layers are formed in particular as thin metal layers having a vertical thickness which is for instance at least two times, five times, ten times or for instance at least twenty times smaller than a vertical thickness of the through contacts. The small thickness of the connection layers in comparison with the through contacts allows the use of processes that are simple to control for applying layers for instance at the wafer level. In this case, the connection layers serve as a basis for subsequent process steps, for instance for producing through contacts in particular in the form of connection columns through the molded body or through the carrier. The formation of through contacts and connection layers can thus be carried out efficiently in a simplified manner by different connecting techniques.

The connection layers can be formed here in each case as a metal layer, wherein the metal layer has an average vertical thickness which is in particular at most 15 µm. By way of example, the vertical thickness of the connection layers is at least 4 µm. For instance, an average vertical thickness of the first and/or second connection layer is between 4 and 15 µm inclusive, for instance between 4 and 10 µm inclusive, or between 4 and 8 µm inclusive, for example approximately 6 µm. With such a vertical thickness, the connection layers can be applied on the semiconductor layer stack in a simplified manner in particular by an electrolytic process or an electroless deposition process, since the small thickness of the connection layers allows a use of resists that are significantly easier to handle than a dry resist for instance. That is to say that the first and/or the second connection layer having such a small thickness can be applied on the semiconductor layer stack without great complexity for example by the structured application of metal layers by an electrolytic or electroless coating method, wherein the application and processing of a comparatively thick dry resist layer can be dispensed with.

In accordance with at least one embodiment of the method, the through contacts are applied on the respective connection layers in each case by means of a printing method, by means of a screen printing method or a stencil printing method. In this case, the connection material for forming the through contact can be formed in the form of a paste containing a tin-, silver- and/or copper-containing solder material. In a subsequent remelting step, the through contacts formed in particular as solder balls can form from the connection material formed for instance as solder paste. For example, the through contacts are formed as SAC solder balls (SnAgCu solder balls).

In accordance with at least one embodiment of the method, the through contacts are deposited onto the respective connection layers in particular in a structured manner in each case by a coating method, for instance by means of an electrolytic or electroless coating method. In this case, the connection layers can serve as seed layers for the through contacts. The connection material can be formed from a metal, for example, from copper, or from an electrically conductive and solderable material. The through contacts can subsequently be remelted to form solder balls.

In accordance with at least one embodiment of the method, the through contacts are provided in a prefabricated manner. In this case, the prefabricated through contacts can be formed as metallic balls and/or as solder balls. The through contacts can be positioned in a parallel fashion on the respective connection layers for example by means of a stencil. The through contacts are then mechanically and electrically conductively connected to the respective connection layers, for instance are permanently secured to the connection layers using pressure and/or heat for instance by thermocompression. Other connecting techniques can likewise be used here, for example laser welding, hot caulking, soldering, thermocompression welding, friction welding or thermocompression bonding.

In accordance with at least one embodiment of the method, the molded body material for forming the molded body is applied on the composite by hotpressing and is thus secured to the composite and to the through contacts. In this case, the molded body material may include a matrix material reinforced with fibers, for instance fabric fibers or glass fibers.

By way of example, the matrix material is a resin material such as an epoxy resin, for instance. Additionally or alternatively, the matrix material can be filled with white particles for instance with reflective and/or scattering particles composed of titanium oxide or silicon oxide. For instance, the molded body material is only partly crosslinked rather than completely crosslinked before being applied on the composite, as a result of which the molded body material can be processed in a simplified manner and the shape of the molded body can easily be modeled or altered. In particular, the molded body material is formed in the form of a two-phase film (bistage moldsheet) including a matrix material, fibers such as, for instance, glass fibers and/or fillers such as, for instance, white particles, wherein the matrix material with the fibers and/or fillers is not completely crosslinked and is only completely crosslinked after application or during application on the composite for instance by means of a thermal treatment.

The molded body material can be a printed circuit board material. A printed circuit board material is understood to mean a material which is used in the printed circuit board industry for the production of printed circuit boards, and includes for example a fiber-reinforced matrix material, wherein the fibers are embedded in the matrix material. By way of example, the molded body material includes a fiber-reinforced reaction resin. In particular, the molded body is formed from an FR4 prepreg layer or from a plurality of prepreg layers (laminate). The FR4 material is usually filled with glass fibers and therefore has a particularly high mechanical stability, for instance a significantly higher stability than a potting material filled with silicon-containing particles. The hot-pressed molded body and the component to be produced are thus formed in a particularly stable manner to withstand fracture.

In this case, the through contacts can be covered by the molded body material, such that the molded body can be partly etched, mechanically eroded, ground or partly removed by means of laser ablation in order to expose the through contacts in a subsequent method step.

In accordance with at least one embodiment of the method, the molded body material is applied on the composite by means of a molding method in particular under the action of pressure and is thus secured to the composite and to the through contacts. A molding method is generally understood to mean a method by which a molding compound can be configured in accordance with a predefined shape, for example, under the action of pressure, and if necessary cured. In particular, the term "molding method" encompasses molding, film assisted molding, injection molding, transfer molding and compression molding.

In a plan view of the composite the through contacts can be completely covered by the molded body material. In this case, the molded body can have an average vertical thickness which, for instance, is greater than an average vertical thickness of the through contact or greater than the sum of the average vertical thicknesses of the connection layers and through contacts together. It is also possible for the molded body material to be provided in a viscous or pasty state and applied on the composite such that in a plan view of the composite the through contacts remain regionally free of the molded body material. That is to say that the through contacts project in particular beyond the molded body in the vertical direction. In this case, it is also possible for the molded body material for forming the molded body to be applied on the composite such that in a plan view of the composite the through contacts are covered only by flash. The flash can subsequently be removed from the through contacts for instance by an etching method, such that the through contacts project beyond the molded body in the vertical direction after the removal of the flash. Before the removal of the flash, the latter can simulate a surface, in particular a curved surface, of the respective through contacts. For this purpose, compression molding with a liquid to viscous potting compound is particularly suitable, wherein the amount of molded body material offered is in particular only such that the through contacts, which are formed for instance as solder balls, are only partly embedded in the molded body. That is to say that in this case the through contacts can project beyond the molded body, wherein the through contacts are enclosed by the molded body for example fully circumferentially in the lateral directions and in a plan view of the semiconductor layer stack, starting from a vertical height, are free of the molded body material or are covered at most by the molded body material in the form of flash that can subsequently be removed.

If the through contacts are formed from a solderable material, in particular as projecting solder balls, for example for connecting the component to be produced for instance on a printed circuit board it is already sufficient to provide a flux since the component to be produced, after the completion thereof, with the through contacts, already brings along a solder reservoir for possible mounting.

In accordance with at least one embodiment of the method, the molded body is formed such that in a plan view of the semiconductor layer stack the through contacts are completely covered by the molded body material and the molded body formed thereby has an average thickness which is greater than an average vertical thickness of the through contacts. In order to expose the through contacts, the molded body can regionally be mechanically removed, for instance ground, or openings are formed in the molded body for example by means of laser ablation.

In accordance with at least one embodiment of the method, the molded body material for forming the molded body is applied on the composite such that both the through contacts and the connection layers are enclosed by the molded body fully circumferentially in the lateral directions. An intermediate region formed in the lateral direction between the connection layers and/or between the through contacts is thus filled completely, in particular, by the molded body material. The molded body is, for example, formed integrally. In this case, the through contacts are completely surrounded in particular in the lateral directions. That is to say that the side surfaces of the through contacts and/or of the connection layers can be completely covered by the molded body.

In accordance with at least one embodiment of the method for producing a plurality of components, the composite including a plurality of first and a plurality of second connection layers is provided. A plurality of first and second through contacts can be formed on the connection layers. In this case, the composite may include one or more isolation trenches between the components to be produced. In the vertical direction the isolation trench or the plurality of isolation trenches can extend regionally into a semiconductor layer stack. The isolation trench or the plurality of isolation trenches can be partly or completely filled by the molded body material during the process of forming the molded body. After the formation of the molded body, the composite can be singulated into a plurality of components along the isolation trench or along the plurality of isolation trenches such that the singulated components each include a carrier and a semiconductor body arranged on the carrier, wherein the semiconductor body emerges from the semiconductor layer stack and the carrier is formed from the singulated molded body, a first through contact and a second through contact. It is also possible for the carrier to include a plurality of the first and/or the second through contacts. The carrier of the singulated component is thus formed directly on the semiconductor layer stack or on the semiconductor body, that is to say at the wafer level and not in a separate method step, such that the completed component in this sense is in particular free of a connecting layer for instance in the form of a soldering layer or an adhesive layer between the semiconductor body and the carrier.

In at least one embodiment of the component, the latter includes a continuous carrier and a semiconductor body arranged on the carrier. The semiconductor body includes a first main surface, which is formed in particular as a radiation passage surface of the component, and a second main surface, which is situated opposite the first main surface and faces the carrier. The component additionally includes a first connection layer and a second connection layer on the side of the second main surface, wherein the connection layers are arranged on the semiconductor body, are assigned to different electrical polarities of the component and are configured for the electrical contacting of the semiconductor body. The carrier is formed from a molded body, a first through contact and a second through contact, wherein the through contacts are in each case electrically conductively connected to one of the connection layers and extend in a vertical direction through the molded body. Consequently, the component is externally electrically contactable in particular via a rear side of the carrier facing away from the second main surface. On a connecting plane between the first connection layer and the first through contact, the first connection layer, for example, has a lateral cross section that is equal to or greater than that of the first through contact. Moreover, the second connection layer on a corresponding connecting plane can have a lateral cross section that is equal to or greater than that of the second through contact. As a result, the through contacts can be formed on the connection layers in a simplified manner. The molded body of the carrier is formed such that the latter encloses both the first connection layer and/or the second connection layer and the first through contact and/or the second through contact fully circumferentially in lateral directions.

The method described above is particularly suitable for the production of a component described here. Features described in association with the component can therefore also be used for the method, and vice versa.

In accordance with at least one embodiment of the component, the latter includes, for mechanical stabilization, a first metal layer arranged between the semiconductor body and the connection layers. The first metal layer is formed such that it laterally bridges, for instance laterally covers or completely covers, an intermediate region formed in the lateral direction between the connection layers and/or between the through contacts. In particular, the first metal layer is free of an interruption in the region of the intermediate region. The first metal layer has a lateral width along the lateral transverse direction which differs for instance at most by 30% from a lateral width of the connection layers or of the through contacts along the lateral transverse direction. In this case, the first metal layer has an average vertical thickness which is, for example, greater than an average vertical thickness of the respective connection layers. In particular, the average vertical thickness of the first metal layer is less than an average vertical thickness of the respective through contacts.

By way of example, the materials of the first metal layer and of the through contacts and also of the connection layers are selected such that the first metal layer has a higher modulus of elasticity and/or a lower thermal conductivity than the connection layers and/or the through contacts. For example, the first metal layer includes nickel. The connection layers and/or the through contacts can in this case be formed from copper or coated with copper. Such a configuration leads to a reduction of the structural height of the component whilst maintaining sufficient mechanical stability of the component and the high efficiency of the heat dissipation through the connection layers and/or the through contacts.

In accordance with at least one embodiment of the component, the molded body is anchored with the first through contact and/or with the first connection layer by means of an anchoring structure. The anchoring structure can be formed by a curved side surface of the first through contact and/or by a step, wherein the step is attributable in particular owing to the different cross sections of the first connection layer and of the first through contact on the connecting plane thereof. The molded body can entirely analogously be anchored with the second through contact and/or with the second connection layer by means of a corresponding anchoring structure. Such an anchoring increases the mechanical stability of the carrier since slipping or detachment of the through contacts from the molded body is largely or completely prevented.

In accordance with at least one embodiment of the method, the first and/or second through contact are/is formed from an electrically conductive and solderable material, wherein the first and/or second through contact in plan view are/is free of the molded body or project(s) beyond the molded body. The component thus already brings along a solder reservoir for possible component mounting. In this case, the first and/or second through contact are/is formed in particular integrally, that is to say for instance in a manner producible in a single method step.

In accordance with at least one embodiment of the component, the latter includes a wiring structure and an insulation structure. The insulation structure is formed continuously, in particular. That is to say that the insulation structure may include a plurality of insulation layers which for example are produced in separate method steps that adjoin one another. In particular, the first and second connection layers are electrically conductively connected to the wiring structure. The wiring structure is configured such that the first connection layer and the second connection layer are electrically conductively connected by the wiring structure in each case to a first semiconductor layer of a first charge carrier type and respectively to a second semiconductor layer of a second charge carrier type of the semiconductor body.

The wiring structure and the insulation structure can extend regionally into the semiconductor body and/or into the carrier and be arranged regionally between the semiconductor body and the carrier of the component in the vertical direction. The semiconductor body includes in particular an active layer arranged between the first semiconductor layer and the second semiconductor layer and configured, for example, for emitting or for detecting electromagnetic radiations during operation of the component. The wiring structure may include a plated-through hole which, for the electrical contacting for instance of the first semiconductor layer, extends from the second main surface through the second semiconductor layer and the active layer into the first semiconductor layer. In this case, the plated-through hole can be electrically insulated from the second semiconductor layer and also from the active layer for instance by the insulation structure. The wiring structure may include a plurality of such plated-through holes in order to improve the current distribution in the first semiconductor layer.

Further advantages, various embodiments and developments of the method and of the component will become apparent from the embodiments explained below in association with FIGS. 1A to 10B.

BRIEF DESCRIPTION OF THE DRAWINGS

In the drawings:
FIGS. 1A to 5 show various method stages of one embodiment of a method for producing one or a plurality of components in schematic sectional views,
FIGS. 6 to 8 show various method stages of a further embodiment of a method for producing one or a plurality of components in schematic sectional views.

Elements that are identical, of identical type or act identically are provided with identical reference signs in the figures. The figures are in each case schematic illustrations and therefore not necessarily true to scale. Rather, comparatively small elements and in particular layer thicknesses may be illustrated with an exaggerated size for clarification.

DETAILED DESCRIPTION

Figure 1A:
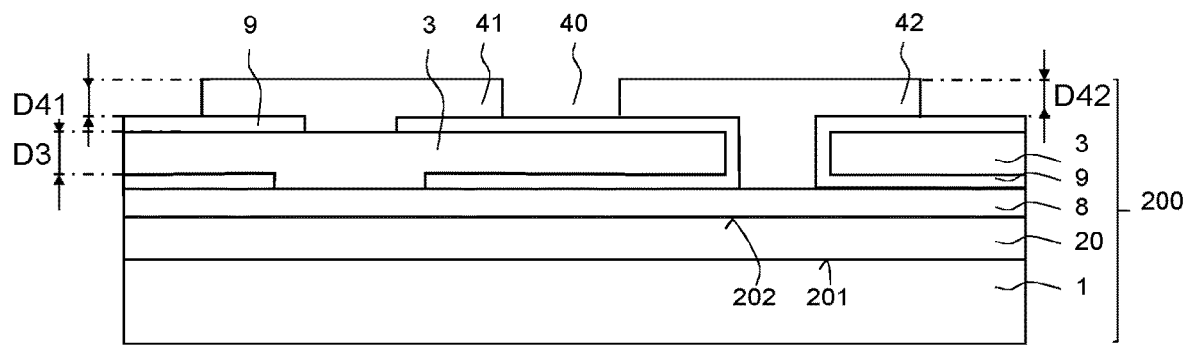

FIG. 1A illustrates a composite 200. The composite includes a semiconductor layer stack 20. The semiconductor layer stack 20 is arranged on a substrate 1. The substrate 1 is in particular a growth substrate, for instance a sapphire substrate, wherein the semiconductor layer stack 20 is deposited onto the growth substrate layer by layer for instance by an epitaxy method. The semiconductor layer stack 20 includes a first main surface 201 facing the substrate 1 and a second main surface 202 facing away from the substrate 1. In particular, the first main surface 201 is formed by a surface of a first semiconductor layer 21 and the second main surface 202 is formed by a second semiconductor layer 22 of the semiconductor layer stack 20. The semiconductor layer stack 20 additionally includes an active layer 23 arranged between the first semiconductor layer 21 and the second semiconductor layer 22.

The composite 200 includes a wiring structure 8 on the side of the second main surface 202 of the semiconductor layer stack 20. The wiring structure 8 extends in a connecting plane and is configured for the electrical contacting of the semiconductor layer stack 20, wherein the wiring structure 8 can be electrically conductively connected directly to various semiconductor layers of the semiconductor layer stack 20. The composite 200 includes a first metal layer 3. The first metal layer 3 can be applied on the wiring structure 8 and/or on the semiconductor layer stack 20, for example, in a structured manner for instance by means of a coating method. In particular, the first metal layer contains a metal, for example Ni or Cu.

Furthermore, the composite 200 includes a first connection layer 41 and a second connection layer 42 spaced apart laterally from the first connection layer 41. In particular, the semiconductor layer stack 20 can be electrically contacted via the first connection layer 41 and the second connection layer 42. The first and second connection layers 41, 42 are assigned to different electrical polarities of the component 100 to be produced and are electrically conductively connected to the respective semiconductor layers of the semiconductor layer stack 20 for instance via the wiring structure 8. The connection layers 41 and 42 may include copper or consist of copper.

In FIG. 1A, the first metal layer 3 is arranged between the semiconductor layer stack 20 and the connection layers 41 and 42 in the vertical direction. The composite 200 includes an insulation structure 9, wherein the first metal layer 3 is electrically insulated from one of the connection layers, from the second connection layer 42 in FIG. 1A, by means of the insulation structure 9. The insulation structure 9 has an opening through which the first connection layer 41 extends in order to form an electrical contact with the first metal layer 3. In FIG. 1A, the first metal layer 3 and the insulation structure 9 have a common opening through which the second connection layer 42 extends in order to form an electrical contact with the wiring structure 8. In this case, the first metal layer 3 can be formed in a continuous and integral fashion.

Furthermore, the insulation structure 9 has a further opening, through which the first metal layer 3 extends to the wiring structure 8. The wiring structure 8 and the insulation layer 9 are illustrated schematically in a simplified manner in FIG. 1A. In a departure from FIG. 1A, the wiring structure 8 and/or the insulation structure 9 can extend regionally into the semiconductor layer stack 20. The wiring structure 8 may include partial regions which for instance are electrically insulated from one another by the insulation structure 9 and are thus assigned to different electrical polarities of the component to be produced. The insulation structure 9 of a respective component to be produced is formed in particular as a continuous insulation structure. In this case, the continuous insulation structure 9 may include electrically insulating partial layers which for instance are formed in separate method steps and directly adjoin one another and thus form a continuous structure. By way of example, the insulation structure 9 includes an electrically insulating material such as silicon oxide, for instance silicon dioxide, and/or silicon nitride or consists of at least one of these materials.

The first metal layer 3 and/or the connection layers 41, 42 can be deposited onto the semiconductor layer stack 20 in each case by means of an electrolytic or electroless coating method. In particular, the first metal layer 3 and/or the connection layers 41 and 42 are applied on the semiconductor layer stack 20 with the aid of a resist layer, which is structured, in particular. The first metal layer 3 has a vertical thickness D3 which is in particular between 3 and 30 µm inclusive, for example, between 6 and 15 µm, for instance approximately 10 µm.

The first connection layer 41 and the second connection layer 42 have a first vertical thickness D41 and a second vertical thickness D42, respectively, wherein the thicknesses of the connection layers are in each case in particular between 4 and 15 µm inclusive, for example, between 4 and 10 µm inclusive, or between 4 and 8 µm, for instance approximately 6 µm thick. In particular, the first metal layer 3 has an average thickness which is greater than an average thickness of the connection layer 41 and/or connection layer 42. By way of example, a ratio of the average thickness of the first metal layer 3 to the average thickness of the connection layers is between 1 to 2 inclusive or between 1 to 3 inclusive or between 1 to 5 inclusive. In particular, the first metal layer 3 is formed with a thickness such that the first metal layer 3 is formed as mechanically stable, in particular self-supporting, and thus contributes to the mechanical stabilization of the semiconductor layer stack 20 or of the component 100 to be produced.

The first metal layer 3 and the connection layers 41 and 42 are in each case formed in particular from a metal such as, for instance, copper or nickel, or from a metal alloy. In particular, the connection layers 41 and 42 and also the first metal layer 3 are configured such that the first metal layer 3 in plan view laterally bridges or covers an intermediate region 40 arranged between the connection layers 41 and 42. In particular, the first metal layer 3 can completely cover the intermediate region 40. As a result of the intermediate region 40 being bridged or covered by the first metal layer 3, the component 100 to be produced is mechanically reinforced by the first metal layer 3 at locations of the intermediate region 40, as a result of which the mechanical stability of the component is increased.

By way of example, the first metal layer 3 and the connection layers 41 and 42 are formed with regard to their materials such that the first metal layer has a higher modulus of elasticity than the connection layers 41 and 42 and/or the connection layers have a higher thermal conductivity than the first metal layer 3. By way of example, the first metal layer 3 includes nickel and the connection layer 41 and/or 42 includes copper.

Figure 1B:
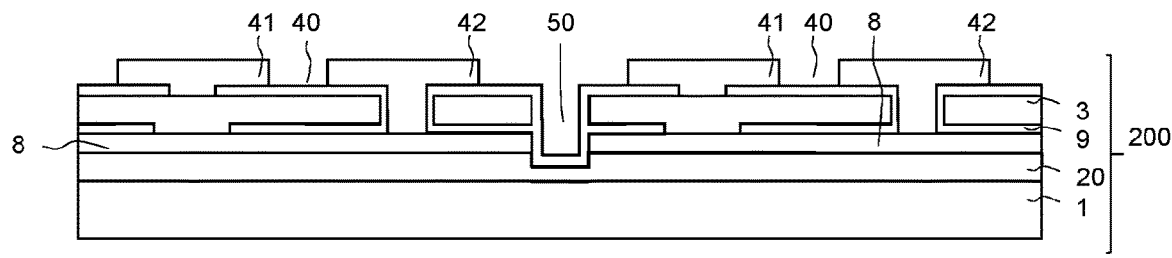

The embodiment illustrated in FIG. 1B substantially corresponds to the embodiment illustrated in FIG. 1A. In contrast thereto, the composite includes a plurality of first metal layers 3, a plurality of first connection layers 41 and also a plurality of second connection layers 42. The first metal layers 3 are spaced apart laterally for instance by an isolation trench 50. The isolation trench 50 can extend in the vertical direction from the side of the connection layers into the semiconductor layer stack 20. In a departure from FIG. 1B, the composite 200 may include a plurality of isolation trenches 50. Along the isolation trenches 50, the composite 200 can be singulated into a plurality of components, such that the singulated components include a semiconductor body 2, one of the first metal layers 3, one of the first connection layers 41 and one of the second connection layers 42, wherein the semiconductor body 2 emerges from the semiconductor layer stack 20. The insulation structure 9 can be formed such that it extends regionally into the isolation trench 50. In particular, the insulation structure 9 can cover a bottom surface of the isolation trench 50, wherein the composite 200 is severed during singulation through the insulation structure 9 in the isolation trench 50. In a departure from FIG. 1B, the first metal layer 3 can likewise extend at least partly into the isolation trench 50.

Figure 2:
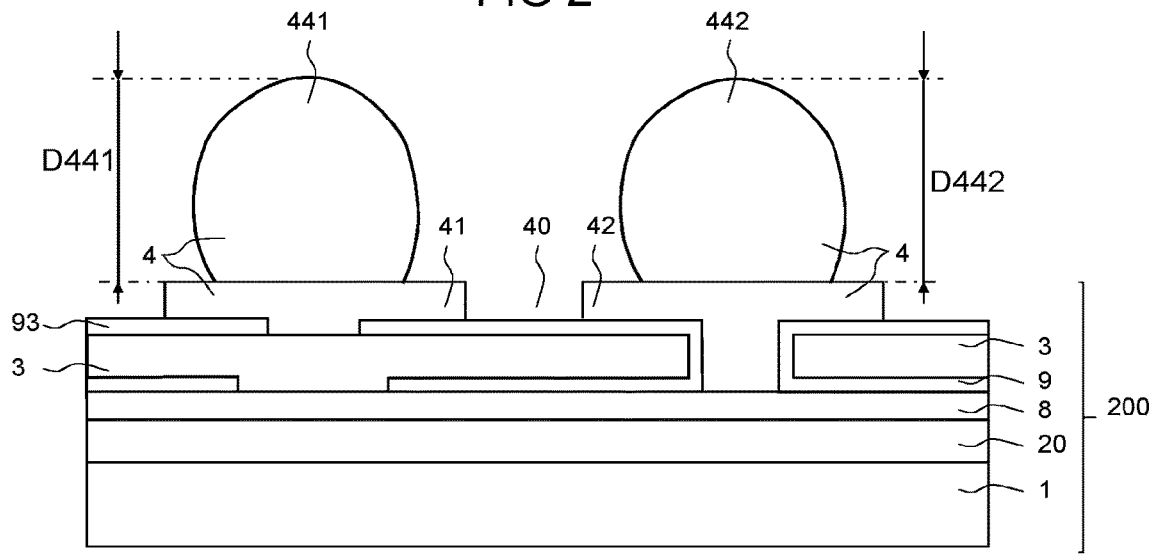

In FIG. 2, the first through contact 441 and the second through contact 442 are in each case applied on the first connection layer 41 and on the second connection layer 42, respectively. The through contacts 441 and 442 each have a vertical thickness D441 and D442, respectively. In case of doubt, a vertical thickness of a layer is understood as an average vertical thickness of said layer. The through contacts 441, 442 and the connection layers 41, 42 thus form a second metal layer 4 of the component 100 to be produced. The second metal layer 4 of a respective component to be produced is subdivided for instance into at least two partial regions spaced apart laterally from one another, wherein a first partial region includes a first through contact 441 and a first connection layer 41 and a second partial region includes a second through contact 442 and a second connection layer 42.

On a connecting plane between the connection layers and the through contacts, the connection layers 41, 42 in FIG. 2 each have a greater lateral cross section than the corresponding through contact 441, 442. In the lateral direction, a step is respectively formed upon the transition from the connection layer 41 or 42 to the through contact 441 or 442, wherein a step extends circumferentially around the associated through contact in the lateral directions. The through contacts 441 and 442 each have a curved side surface. The side surface is illustrated as convex in FIG. 2. It is also possible for the side surfaces of the through contacts to be formed in a concave fashion. FIG. 2 illustrates the through contacts in each case in an ellipsoidal fashion with in each case a flat surface facing the connection layers 41 and 42. In a departure therefrom, the through contact can assume for instance the shape of a sphere, a cylinder, a truncated cone, a truncated pyramid or else other shapes.

The vertical thicknesses of the through contacts D441 and D442 are in particular greater than the vertical thicknesses of the first metal layer D3 and of the connection layers D41 and D42. For example, the thickness of a through contact is between 10 μm and 300 μm inclusive, for instance between 20 μm and 200 μm or between 50 μm and 100 μm inclusive. In particular, the vertical thickness of a through contact is at least two times, for instance four times or ten times, the magnitude of the vertical thickness of the first metal layer 3 and/or of the connection layers 41 and 42. By way of example, a ratio of the thickness of the through contacts 441 and 442 to the thickness of the first metal layer 3 and/or of the connection layers 41 and 42 is between 2 to 30 inclusive, for instance between 4 to 20 or between 5 to 10.

The through contacts 441 and 442 can be provided in a prefabricated fashion and be secured to the first and second connection layers 41, 42 by means of a connecting method such as, for example, soldering, bonding, adhesive bonding, hotpressing or by thermocompression bonding. Moreover, the through contacts 441 and 442 can be applied on the connection layers 41 and 42 by means of a screen printing method or stencil printing method. It is also possible for the through contacts 441 and 442 to be deposited onto the connection layers 41 and 42 in a structured manner in each case by means of an electrolytic or electroless coating method. In particular, the connection layers 41 and 42 here can serve as seed layers for the through contacts 441 and 442. The connection layers and through contacts can be formed from a metal, for instance from copper. For forming the through contacts 441 and 442, use is made of copper, in particular, on account of its excellent electrical and thermal conductivity. In comparison with further high-performance materials such as silver and gold, copper is particularly cost-effective. The connection layers 41 and 42 can each likewise be formed from copper or be coated at least with copper, thereby forming optimum mechanical, electrical and thermal connections between the connection layers and the through contacts. Moreover, copper is relatively soft in comparison with other metals such as nickel or iron, for instance, such that the connection layers or through contacts formed from copper can successfully absorb external mechanical influences. Moreover, copper and many commercially available molded body materials have a comparable coefficient of thermal expansion, such that a carrier formed for instance from copper and a commercially available molded body material is particularly stable vis-à-vis temperature changes. Furthermore, the through contacts 441 and 442 can be formed from a solderable material or be coated with such a material. Solderable materials here may include for example materials which are suitable for soft soldering.

In FIG. 3, a molded body material is applied from the composite 200 for forming a molded body 10. In this case, the molded body material can be a fiber-reinforced printed circuit board material. The molded body material can be applied on the composite for example by hotpressing and thus be secured to the composite and to the through contacts. Moreover, the molded body material can be a potting compound which is applied on the composite 200 for instance by a molding method. In FIG. 3, the through contacts 441 and 442 are completely covered by the molded body material. In this case, the through contacts 441 and 442 are completely embedded in the molded body 10 apart from the surfaces adjoining the connection layers 41 or 42.

In this case, the molded body material can be filled, in particular highly filled, with white particles, for instance with scattering or reflective particles such as titanium oxide or silicon oxide particles. A material which is highly filled with white particles is understood to mean a material which includes a matrix material and white particles embedded into the matrix material, wherein the white particles make up for instance at least 30 or 40 or 60, for instance at least 70 or at least 80, % by weight or volume of the highly filled material. In the case of a glass-fiber-reinforced epoxy resin including highly filled white particles, the proportion of white particles can also be less than 60%.

In order to expose the through contacts 441 and 442, the molded body 10 is partly removed or thinned. This can be carried out by grinding back the molded body 10 or by partial removal by means of laser ablation. In FIG. 4, the through contacts 441 and 442 terminate flush with the molded body 10 in a vertical height. The through contacts 441 and 442 thus each have an exposed surface at which the component 100 to be produced can be externally electrically contacted. The exposure of the through contacts 441 and 442 for instance by means of grinding back furthermore exposes a solderable surface of the corresponding through contact, such that an additional metallization can be dispensed with.

FIG. 5 illustrates that the growth substrate 1 can be removed from the component 100 to be produced for instance by means of a mechanical method, an etching method or by means of a laser lift-off method. The separation of the growth substrate 1 can be carried out before the singulation or after the singulation of the composite 200 into a plurality of components 100. In order to increase the coupling-in and/or coupling-out efficiency, a surface 101 of the component 100 that is exposed as a result of the removal of the growth substrate can be structured. In this case, the surface 101 is formed as a radiation passage surface of the component 100 and can be a surface of the semiconductor body 2 or a surface of a protective layer arranged on the semiconductor body 2. The component 100 includes a rear side 102, facing away from the radiation passage surface 101, with exposed surfaces of the through contacts 441 and 442. In a departure from FIG. 5, each singulated component may include a plurality of first through contacts 441 and/or a plurality of second through contacts 442.

The embodiment illustrated in FIG. 6 substantially corresponds to the embodiment illustrated in FIG. 3 for a method for producing one or a plurality of components. In contrast thereto, the molded body material for forming the molded body is applied on the composite 200 such that the through contacts 441 and 442 regionally remain free of the molded body material. The through contacts 441 and 442 thus project beyond the molded body 10 in a vertical direction. In this case, the molded body material can be provided as a potting compound, in particular in a liquid to viscous state, and can be applied on the composite 200 for example by means of a molding method. In this case, the molded body material is, for example, applied on the composite 200 by means of compression molding. A partial removal of the molded body 10, for example by grinding back, can thus be disposed of. As a result, it is possible for example to avoid a situation in which metal residues that arise for instance in the course of the exposure of the through contacts 441 and 442 can reach a front side of the component 100 to be produced and can thereby possibly damage the semiconductor body 2 and thus the component 100. Since the molded body 10 need not subsequently be processed regarding the exposure of the through contacts 441 and 442, the molded body has a higher stability overall even in view of its molded body material which is highly filled with scattering particles, for instance with silicon oxide or titanium oxide particles, and is thus slightly fragile. The component can thus be configured to be stabler to withstand fracture.

Figure 7:
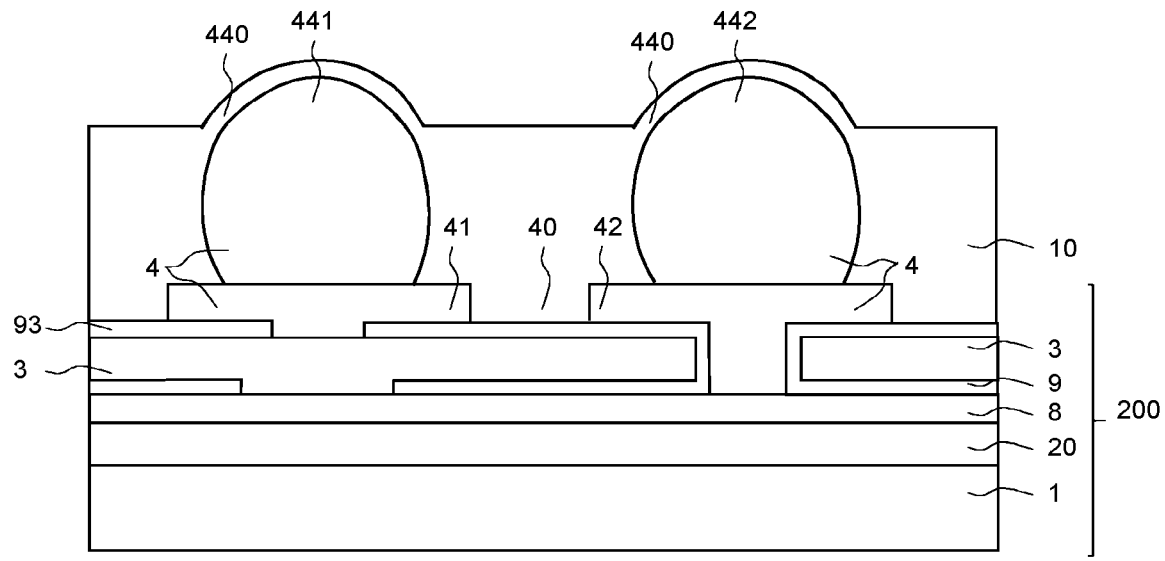

The embodiment illustrated in FIG. 7 substantially corresponds to the embodiment illustrated in FIG. 6. In contrast thereto, FIG. 7 illustrates that flash 440 may remain on the through contacts 441 and 442. Said flash is embodied in a particularly thin fashion and in this case simulates the shape of those partial regions of the through contacts 441 and 442 which project beyond the molded body 10. Consequently, the flash 440 cannot be regarded as part of the molded body 10. Said flash 440 may remain on the finished component until the component 100 is used, for instance is applied on a printed circuit board, secured thereon and electrically connected to an external electrical source. The flash 440 remaining on the component 100 can protect the component, in particular the through contacts, in particular against external influences, for example against oxidation, for instance during packaging or during transport. In a subsequent method step, the flash 440 can also be removed afterward by means of a wet-chemical etching step. Such an etching step can also be carried out in a dry-chemical fashion, for instance by means of an O2-containing plasma. In this case, the molded body 10 is not altered or is only altered insignificantly and in this case maintains its original shape, in particular with regard to the shape of the molded body.

Figure 8:
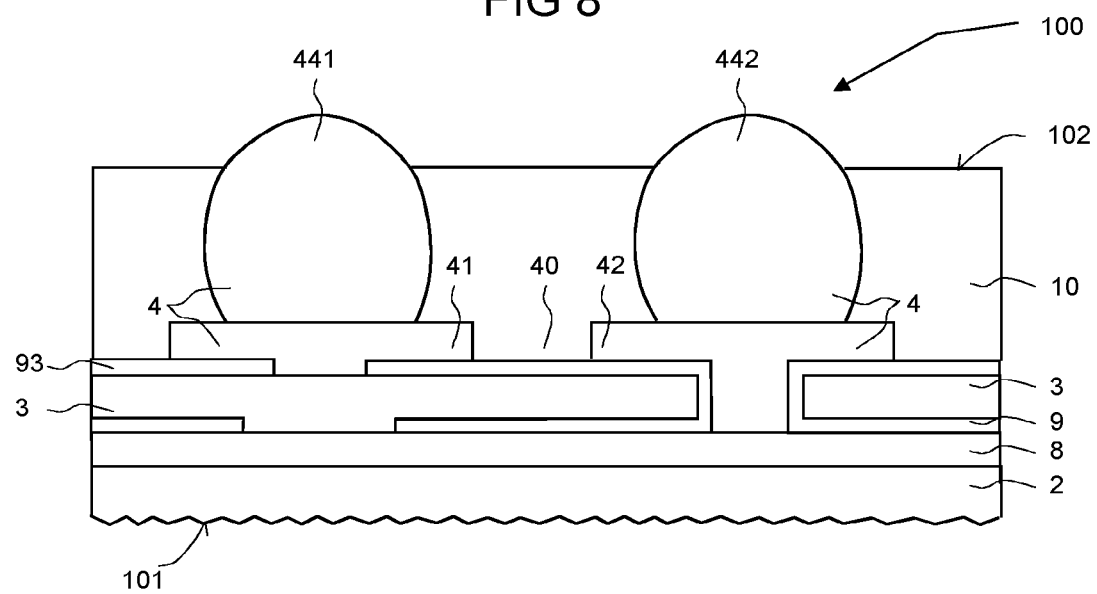

The component 100 illustrated in FIG. 8 substantially corresponds to the embodiment illustrated in FIGS. 6 and 7. In contrast thereto, the component 100 is free of a growth substrate 1. The component 100 includes a structured radiation passage surface 101. In particular, the component 100 is electrically contactable via the rear side 201. That is to say that the component 100 is configured as a component which is electrically contactable at the rear side and is thus surface-mountable.

Figure 9A:
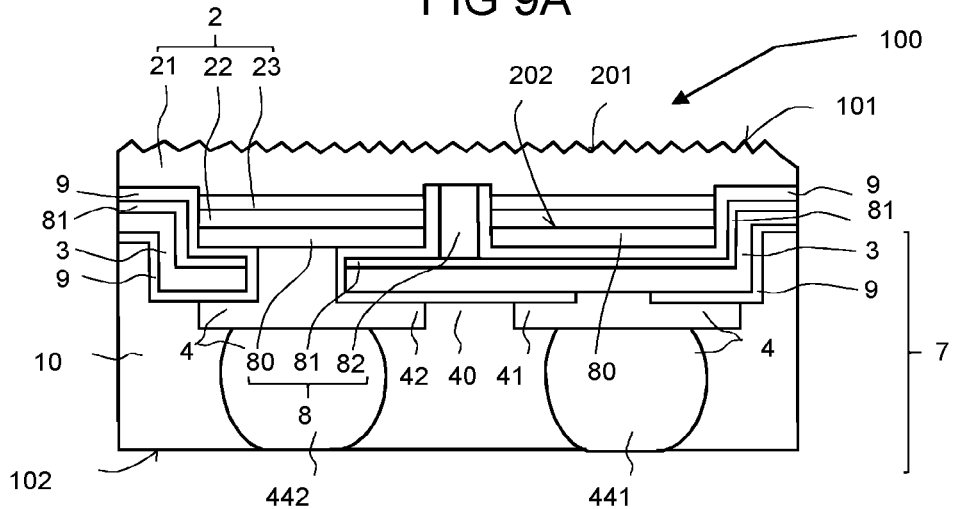
FIGS. 9A to 10B show various embodiments of a component in schematic sectional views.
Figure 9B:
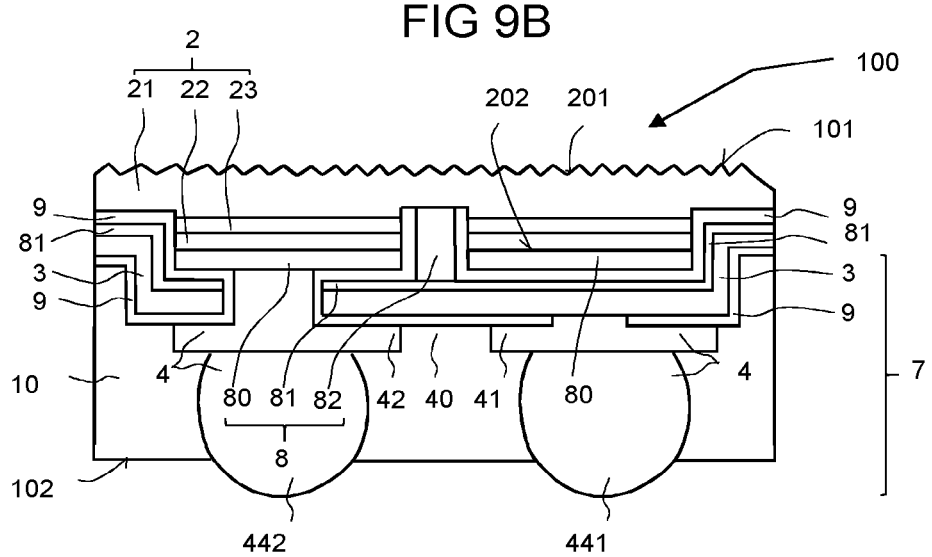

The embodiments of a component that are illustrated in FIGS. 9A and 9B correspond to the embodiments illustrated in FIGS. 5 and 8, respectively. In contrast thereto, the wiring structure 8 and the insulation structure 9 are illustrated in greater detail in FIGS. 9A and 9B.

In FIG. 9A, the wiring structure 8 includes a current spreading layer 80, an electrically conductive layer 81 and a plated-through hole 82. In this case, the wiring structure 8 extends regionally into the semiconductor body 2 and regionally into the carrier 7 or at least regionally adjoins the carrier 7. The first partial region of the second metal layer 4 having the first through contact 441 and the first connection layer 41 is electrically conductively connected to the first semiconductor layer 21 of the semiconductor body 2 via the first metal layer 3, the electrically conductive layer 81 and the plated-through hole 82. The second partial region of the second metal layer 4 having the second through contact 442 and the second connection layer 42 is electrically conductively connected to the second semiconductor layer 22 of the semiconductor body 2 via the current spreading layer 80. In this case, the first metal layer 3 has an opening through which the second connection layer 42 extends to the current spreading layer 80. The plated-through hole 82 is electrically conductively connected to the first metal layer 3 and formed such that it extends at least from the second main surface 202 through the second semiconductor layer 22 and the active layer 23 for the purpose of electrically contacting the first semiconductor layer 21.

The current spreading layer 80 is in particular simultaneously formed as a diffusion barrier layer and completely covers for instance an opening of the insulation layer 9, through which opening the first metal layer 3 or a connection layer 42 extends. The diffusion barrier layer can prevent migration of metal atoms or metal ions, for instance copper atoms or copper ions, into the semiconductor layer stack 20 or into the semiconductor body 2. A risk for instance regarding copper contamination can thus be minimized. The current spreading layer 80 and the insulation structure 9 have a common opening through which the plated-through hole 82 extends for instance from the electrically conductive layer 81 to the semiconductor body 2.

The electrically conductive layer 81 is formed in particular as a mirror layer and in this case may include a metal, for instance aluminum, rhodium, palladium, silver or gold. In this case, the electrically conductive layer 81 covers the active layer 23 at least regionally in plan view. Along the vertical direction the electrically conductive layer 81 can extend laterally with respect to the semiconductor body 2 to an extent such that it laterally surrounds the second semiconductor layer 22 or the active layer 23. Electromagnetic radiations emerging laterally or rearwardly from the semiconductor body 2 can thus be reflected back again in the direction of the active layer 23 or in the direction of the radiation passage surface 101 of the component, as a result of which the efficiency of the component is increased. In FIG. 9A, the electrically conductive layer 81 is formed in a continuous fashion.

In FIG. 9A, the insulation structure 9 is illustrated as a continuous insulation structure which extends regionally into the semiconductor body 2 and regionally into the carrier 7 or at least regionally adjoins the carrier 7. The plated through hole 82 is electrically isolated from the second semiconductor layer 22 and from the active layer 23 in the region of the semiconductor body 2 in the lateral direction by the insulation structure 9. By the insulation structure 9, the first metal layer 3 is electrically isolated from the second partial region of the second metal layer 4 having the second through contact 442 and the second connection layer 42.

The embodiment illustrated in FIG. 9B substantially corresponds to the embodiment illustrated in FIG. 9A. In contrast thereto, as also illustrated in FIG. 8, the through contacts 441 and 442 project beyond the molded body 10.

Figure 10A:
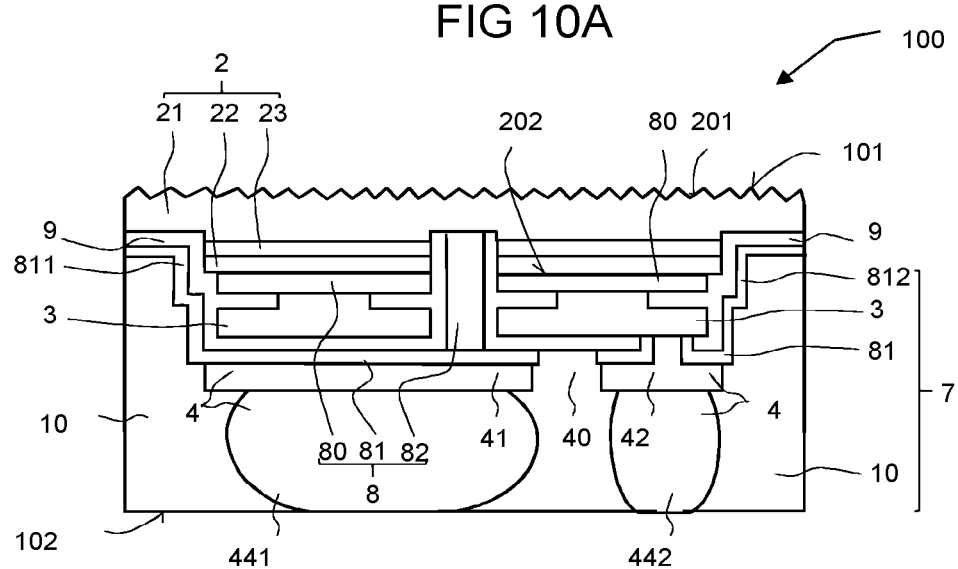
Figure 10B:
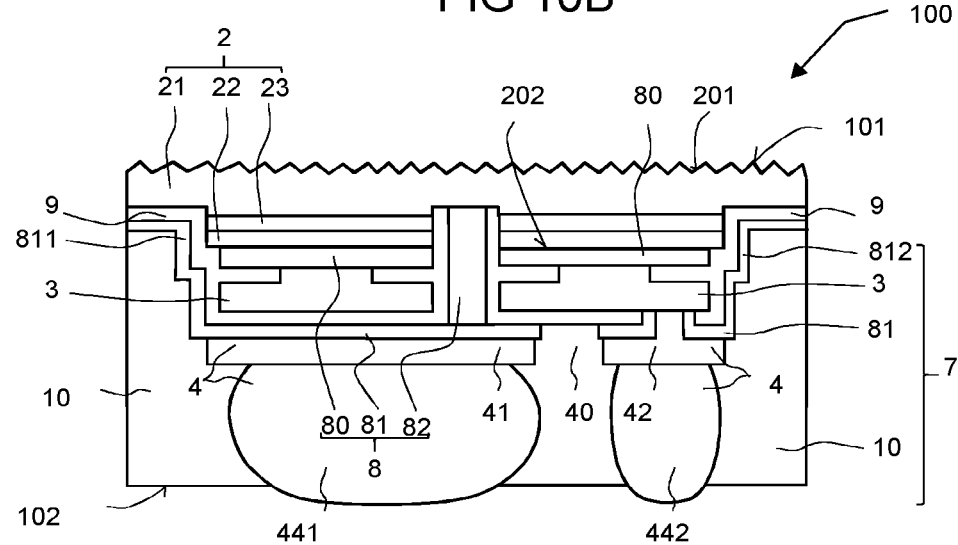

FIGS. 10A and 10B illustrate further embodiments of a component. The embodiments illustrated in FIGS. 10A and 10B substantially correspond to the embodiments illustrated in FIGS. 9A and 9B, respectively.

In contrast thereto, the plated-through hole 82 extends through the first metal layer 3. In this case, the first metal layer 3 and the insulation structure 9 have a common opening. In contrast to FIG. 9A or 9B, in which the first metal layer 3 is arranged between the electrically conductive layer 81 and the metal layer 4 in the vertical direction, in FIGS. 10A and 10B the electrically conductive layer 81 is arranged between the first metal layer 3 and the second metal layer 4. Furthermore, the electrically conductive layer 81 is subdivided into a first partial layer 811 and a second partial layer 812, wherein the partial layers 811 and 812 are laterally spaced apart from one another and thus electrically insulated from one another for instance in the region of the intermediate region 40. The partial layers 811 and 812 are electrically conductively connected to the first connection layer 41 and the second connection layer 42, respectively, and thus associated with different electrical polarities of the component 100.

In FIGS. 10A and 10B, the first metal layer 3 is designed for the electrical contacting of the first semiconductor layer 21. The first metal layer 3 is additionally enclosed completely, for instance, by the insulation structure 9 in a lateral direction. In accordance with FIGS. 10A and 10B, the semiconductor body 2 can be enclosed by the insulation structure 9 fully circumferentially in lateral directions at least at the level of the second semiconductor layer 22. The carrier 7 having the molded body 10 can also enclose the semiconductor body 2 fully circumferentially in a lateral direction at the level of the second semiconductor layer 22, such that the carrier 7 is simultaneously formed as a housing for the semiconductor body 2.

A first aspect of the present disclosure relates to a method for producing a component 100, the method including:
  providing a composite 200 including a semiconductor layer stack 20, a first exposed connection layer 41 and a second exposed connection layer 42, wherein the connection layers are arranged on the semiconductor layer stack, assigned to different electrical polarities and are configured to the electrically contact the component to be produced,
  forming a first through contact 441 exposed in lateral directions on the first connection layer and a second through contact 442 exposed in lateral directions on the second connection layer, wherein the through contacts are formed from an electrically conductive connection material, and
  applying a molded body material on the composite for forming a molded body 10, whereby each of the through contacts are fully and circumferentially enclosed by the molded body at least in the lateral directions, such that the molded body and the through contacts form a permanently continuous carrier 7 which mechanically carries the component to be produced.

A second aspect of the present disclosure is a method as described in aspect 1, wherein the through contacts 441, 442 are applied on the respective connection layers 41, 42 by means of a stencil printing method or a screen printing method.

A third aspect of the present disclosure is a method as described in aspect 1, wherein the through contacts 441, 442 are deposited onto the respective connection layers 41, 42 in a structured fashion by means of a coating method.

A fourth aspect of the present disclosure is a method as described in aspect 1, wherein the through contacts 441, 442 are prefabricated, respectively positioned on the respective connection layers 41, 42 and permanently secured thereto with the use of pressure and/or heat.

A fifth aspect of the present disclosure is a method as described in any of the preceding aspects, wherein the molded body material is applied on the composite 200 by hotpressing and is thus secured to the composite and to the through contacts 441, 442.

A sixth aspect of the present disclosure is a method as described in any of aspects 1 to 4, wherein the molded body material is applied on the composite 200 by injection molding or transfer molding or compression molding and is thus secured to the composite and to the through contacts 441, 442.

A seventh aspect of the present disclosure is a method as described in any of the preceding aspects, wherein the molded body material for forming the molded body 10 is applied on the composite 200 such that in a plan view of the composite the through contacts 441, 442 are covered only by a flash, and the flash is subsequently removed, such that the through contacts project beyond the molded body in the vertical direction.

An eighth aspect of the present disclosure is a method as described in any of aspects 1 to 4, wherein the molded body material is provided in a viscous state and is applied on the composite 200 such that in a plan view of the composite the through contacts 441, 442 regionally remain free of the molded body material.

A ninth aspect of the present disclosure is a method as described in any of the preceding aspects, wherein the molded body material for forming the molded body 10 is applied on the composite 200 such that both the through contacts 441, 442 and the connection layers 41, 42 are enclosed by the molded body fully circumferentially in the lateral directions.

A tenth aspect of the present disclosure is a method as described in any of the preceding aspects, wherein the composite 200 is a wafer composite.

An eleventh aspect of the present disclosure is a method as described in any of the preceding aspects for producing a plurality of components 100, wherein the composite 200 includes a plurality of first and second connection layers 41, 42 and a plurality of first and second through contacts 441, 442 are formed on the respective connection layers, wherein the composite includes one or more isolation trenches 50, and after the formation of the molded body 10 the composite is singulated into a plurality of components along the isolation trench or along the isolation trenches in such a way that the components each include a carrier 7 and a semiconductor body 2 arranged on the carrier, wherein the semiconductor body contains a part of the semiconductor layer stack 20, and the carrier contains a part of the molded body, a first through contact 441 and a second through contact 442.

A twelfth aspect of the present disclosure relates to a component 100 including a continuous carrier 7 and a semiconductor body 2 arranged on the carrier, wherein the semiconductor body includes a first main surface 201, which is formed as a radiation passage surface, and a second main surface 202, which is situated opposite the first main surface and faces the carrier, a first connection layer 41 and a second connection layer 42 are arranged on the semiconductor body at the second main surface, wherein the connection layers are assigned to different electrical polarities of the component and are configured for the electrical contacting of the semiconductor body, the carrier is formed from a molded body 10, a first through contact 441 and a second through contact 442, wherein the through contacts 441, 442 are in each case electrically connected to one of the connection layers 41, 42 and extend through the molded body 10 in a vertical direction, as a result of which the component is externally electrically contactable via a rear side of the carrier 102 facing away from the second main surface 202, the first connection layer on a connecting plane with the first through contact has a lateral cross section equal to or greater than that of the first through contact, wherein both the first connection layer and the first through contact are enclosed by the molded body fully circumferentially in lateral directions.

A thirteenth aspect of the present disclosure is a component as described in aspect 12, which includes a first metal layer 3 arranged between the semiconductor body 2 and the connection layers 41, 42, wherein the first metal layer laterally bridges an intermediate region 40 formed in a lateral longitudinal direction between the connection layers and/or between the through contacts 441, 442, wherein the first metal layer has an average vertical thickness D3 which is greater than an average vertical thickness D41, D42 of the respective connection layers and is less than an average vertical thickness D441, D442 of the respective through contacts 441, 442.

A fourteenth aspect of the present disclosure is a component as described in aspect 13, wherein the average vertical thickness D41 of the first connection layer 41 and the average vertical thickness D42 of the second connection layer 42 are in each case between 4 µm and 10 µm inclusive, and the average vertical thicknesses D441, D442 of the through contacts 441, 442 are in each case at least three times the magnitude of the average vertical thicknesses of the respective connection layers.

A fifteenth aspect of the present disclosure is a component as described in either of aspects 13 or 14, wherein the first metal layer 3 is free of an interruption in the region of the intermediate region 40 and has a lateral width along a lateral transverse direction running transversely or perpendicularly with respect to the longitudinal direction, wherein the lateral width of the first metal layer differs at most by 30% from a lateral width of the connection layers 41, 42 along the lateral transverse direction.

A sixteenth aspect of the present disclosure is a component as described in any of aspects 12 to 15, wherein the molded body 10 is anchored with the first through contact 441 and/or with the first connection layer 41 by means of an anchoring structure, wherein the anchoring structure is formed by a curved side surface of the first through contact 441 and/or by a step formed on account of the connection layer 41 and the through contact 441 having cross sections of different magnitudes.

A seventeenth aspect of the present disclosure is a component as described in any of aspects 12 to 16, wherein the through contacts 441, 442 are formed integrally and in each case from an electrically conductive and solderable material, wherein in a plan view of the semiconductor body 2 the through contacts are free of the molded body 10 or project beyond the molded body. An eighteenth aspect of the invention is a component as claimed in any of aspects 12 to 17, which includes a wiring structure 8 and an insulation structure 9, which extend regionally into the semiconductor body 2, wherein the first connection layer 41 and the second connection layer 42 are electrically conductively connected by means of the wiring structure 8 in each case to a first semiconductor layer 21 of a first charge carrier type and respectively to a second semiconductor layer 22 of a second charge carrier type of the semiconductor body 2, the semiconductor body 2 includes an active layer 23 arranged between the first semiconductor layer 21 and the second semiconductor layer 22 and configured for emitting or detecting electromagnetic radiations during operation of the component, and the wiring structure 8 includes a plated-through hole 82 which, for electrically contacting the first semiconductor layer 21, extends from the second main surface 202 through the second semiconductor layer 22 and the active layer 23 into the first semiconductor layer 21 and in so doing is electrically insulated from the second semiconductor layer 22 and also from the active layer 23 by the insulation structure 9.

The present disclosure is not restricted to the subject matter explicitly provided herein. Rather, the present disclosure encompasses any novel feature and also any combination of features, which in particular includes any combination of features herein, even if this feature or this combination itself are not explicitly provided.

The invention claimed is:

1. A method for producing a component, the method comprising:
   providing a composite comprising a semiconductor layer stack, a first exposed connection layer and a second exposed connection layer, wherein the first exposed connection layer and the second exposed connection layer are on the semiconductor layer stack, assigned to different electrical polarities and configured to electrically contact the component to be produced;
   forming a first through contact exposed in lateral directions on the first exposed connection layer and a second through contact exposed in lateral directions on the second exposed connection layer, wherein the first through contact and the second through contact are formed from an electrically conductive connection material; and
   applying a molded body material on the composite for forming a molded body, whereby each of the first through contact and the second through contact are fully and circumferentially enclosed by the molded body at least in the lateral directions, such that the molded body, the first through contact and the second through contact form a permanently continuous carrier which mechanically carries the component to be produced,
   wherein the molded body material for forming the molded body is applied on the composite such that, in a plan view of the composite, the first through contact and the second through contact are covered only by flash, and the first through contact and the second through contact project beyond the molded body in a vertical direction upon removal of the flash.

2. The method of claim 1,
   wherein the first through contact and the second through contact are respectively applied on the first exposed connection layer and the second exposed connection layer by a stencil printing method or a screen printing method.

3. The method of claim 1,
   wherein the first through contact and the second through contact are respectively deposited onto the first exposed connection layer and the second exposed connection layer in a structured fashion by a coating method.

4. The method of claim 1,
   wherein the first through contact and the second through contact are prefabricated, respectively positioned on the first exposed connection layer and the second exposed connection layer and permanently secured thereto with pressure and/or heat.

5. The method of claim 1,
   wherein the molded body material is applied on the composite by hotpressing, and
   wherein the molded body material is thus secured to the composite, the first through contact and the second through contact.

6. The method of claim 1,
wherein the molded body material is applied on the composite by injection molding, transfer molding or compression molding, and
wherein the molded body material is thus secured to the composite, the first through contact and the second through contact.

7. The method of claim 1,
wherein the molded body material is provided and applied on the composite in a viscous state.

8. The method of claim 1,
wherein the molded body material is applied on the composite such that the first through contact, the second through contact, the first exposed connection layer and the second exposed connection layer are fully and circumferentially enclosed by the molded body in the lateral directions.

9. The method of claim 1,
wherein the composite is a wafer composite.

10. The method of claim 1 for producing a plurality of the components,
wherein the composite further comprises a plurality of the first exposed connection layers and a plurality of the second exposed connection layers,
wherein the composite further comprises a plurality of the first through contacts, each of the plurality of the first through contacts being formed on a respective first exposed connection layer of the plurality of first exposed connection layers,
wherein the composite further comprises a plurality of the second through contacts, each of the plurality of the second through contacts being formed on a respective second connection layer of the plurality of the second connection layers,
wherein the composite further comprises one or more isolation trenches,
wherein after the formation of the molded body, the composite is singulated into the plurality of the components along an isolation trench of the one or more isolation trenches or along isolation trenches of the one or more isolation trenches, such that the plurality of the components each comprise a respective carrier and a respective semiconductor body on the respective carrier,
wherein the respective semiconductor body contains a part of the semiconductor layer stack, and
wherein the respective carrier contains a part of the molded body, a respective first through contact of the plurality of the first through contacts, and a respective second through contact of the plurality of the second through contacts.

11. A component comprising:
a continuous carrier; and
a semiconductor body on the continuous carrier,
wherein the semiconductor body comprises a first surface configured to pass radiation, and a second surface, which is situated opposite the first surface and faces the continuous carrier,
wherein a first connection layer and a second connection layer are on the semiconductor body at the second surface,
wherein the first connection layer and the second connection layer are assigned to different electrical polarities of the component and are configured to electrically contact the semiconductor body,
wherein the continuous carrier includes a molded body, a first through contact and a second through contact,
wherein each of the first through contact and the second through contact are electrically connected to one of the first connection layer and the second connection layer and extend through the molded body in a vertical direction, such that the component is externally electrically contactable via a rear side of the continuous carrier facing away from the second surface,
wherein the first connection layer is on a connecting plane with the first through contact and has a lateral cross section greater than or equal to that of the first through contact,
wherein both the first connection layer and the first through contact are fully and circumferentially enclosed by the molded body in lateral directions, and
wherein, in a plan view of the semiconductor body, the first through contact and the second through contact project beyond the molded body.

12. The component of claim 11, further comprising:
a first metal layer between the semiconductor body, the first connection layer and the second connection layer,
wherein the first metal layer laterally bridges an intermediate region formed in a lateral longitudinal direction between the first connection layer and the second connection layer and/or between the first through contact and the second through contact,
wherein the first metal layer has an average vertical thickness which is greater than an average vertical thickness of the first connection layer, and greater than an average vertical thickness of the second connection layer, and
wherein the average vertical thickness of the first metal layer is less than an average vertical thickness of the first through contact and less than an average vertical thickness of the second through contact.

13. The component of claim 12,
wherein the average vertical thickness of the first connection layer and the average vertical thickness of the second connection layer are between 4 μm and 10 μm inclusive,
wherein the average vertical thicknesses of the first through contact is at least three times the average vertical thickness of the first connection layer, and
wherein the average vertical thickness of the second through contact is at least three times the average vertical thickness of the second connection layer.

14. The component of claim 12,
wherein the first metal layer is free of an interruption in a region of the intermediate region and has a lateral width along a lateral transverse direction running transversely or perpendicularly with respect to the lateral longitudinal direction, and
wherein the lateral width of the first metal layer differs at most by 30% from a lateral width of the first connection layer and the second connection layer along the lateral transverse direction.

15. The component of claim 11,
wherein the molded body is anchored with the first through contact and/or with the first connection layer by means of an anchoring structure, and
wherein the anchoring structure includes a curved side surface of the first through contact and/or a step defined by the first connection layer and the first through contact having cross sections of different magnitudes.

16. The component of claim 11,
wherein each of the first through contact and the second through contact comprise an electrically conductive material wherein the first through contact and the second through contact are covered by a flash, and wherein, in the plan view of the semiconductor body, the first through contact, the second through contact, and the flash project beyond the molded body.

17. The component of claim 11, further comprising:

a first semiconductor layer of a first charge carrier type;

a second semiconductor layer of a second charge carrier type; and an active layer which is between the first and second semiconductor layers and is configured to emit or detect electromagnetic radiation during operation of the component.

18. The component of claim 11, further comprising:

a wiring structure and an insulation structure, which extend into the semiconductor body, wherein the first connection layer and the second connection layer are electrically and conductively connected by means of the wiring structure to a first semiconductor layer of a first charge carrier type of the semiconductor body and to a second semiconductor layer of a second charge carrier type of the semiconductor body, respectively, wherein the semiconductor body comprises an active layer between the first semiconductor layer and the second semiconductor layer, wherein the active layer is configured to emit or detect electromagnetic radiation during operation of the component, wherein the wiring structure comprises a plated-through hole configured to electrically contact the first semiconductor layer, and wherein the plated-through hole extends from the second surface through the second semiconductor layer and the active layer into the first semiconductor layer, such that the plated-through hole is electrically insulated from the second semiconductor layer and also from the active layer by the insulation structure.

19. The method of claim 1, wherein the molded body material includes a matrix material reinforced with fibers.

20. The component of claim 12, wherein the first metal layer has a higher modulus of elasticity than the first connection layer and the second connection layer, and/or wherein the first connection layer and the second connection layer have a higher thermal conductivity than the first metal layer.

* * * * *